US006159835A

United States Patent [19]

Visokay et al.

[11] Patent Number: 6,159,835

[45] Date of Patent: Dec. 12, 2000

[54] ENCAPSULATED LOW RESISTANCE GATE STRUCTURE AND METHOD FOR FORMING SAME

[75] Inventors: Mark R. Visokay, Dallas; Dirk N. Anderson, Plano, both of Tex.

[73] Assignee: Texas Instruments Incorporated, Dallas, Tex.

[21] Appl. No.: 09/543,642

[22] Filed: Apr. 6, 2000

Related U.S. Application Data

[62] Division of application No. 09/216,126, Dec. 18, 1998.

[51] Int. Cl.[7] .................... H01L 21/3205; H01L 21/4763

[52] U.S. Cl. ............................................. 438/592; 438/595

[58] Field of Search ............................ 257/365; 438/259, 438/270, 349, 592, 595

[56] References Cited

U.S. PATENT DOCUMENTS

| | | | |
|---|---|---|---|
| 5,349,228 | 9/1994 | Neudeck et al. | 257/365 |
| 5,382,540 | 1/1995 | Sharma et al. | 437/52 |
| 5,397,909 | 3/1995 | Moslehi | 257/383 |
| 5,925,918 | 7/1999 | Wu et al. | 438/595 |
| 5,998,290 | 12/1999 | Wu et al. | 438/595 |
| 6,075,274 | 6/2000 | Wu et al. | 438/595 |

*Primary Examiner*—John F. Niebling
*Assistant Examiner*—Walter L. Lindsay, Jr.
*Attorney, Agent, or Firm*—Jacqueline J. Garner; Wade James Brady, III; Frederick J. Telecky, Jr.

[57] ABSTRACT

An encapsulated gate structure includes a polysilicon layer, a barrier layer overlying the polysilicon layer and having opposing sidewalls, a metal layer overlying the barrier layer and having opposing sidewalls, a top dielectric layer overlying the metal layer and having opposing sidewalls, and a vertically oriented dielectric layer extending over and covering each of the opposing sidewalls of the barrier layer and the metal layer to encapsulate the barrier layer and metal layer on the polysilicon layer. The encapsulated gate and barrier layer are thus unaffected by oxidation and other similar detrimental effects of subsequent processing steps.

2 Claims, 5 Drawing Sheets

ENCAPSULATED LOW RESISTANCE GATE STRUCTURE AND METHOD FOR FORMING SAME

This application is a divisional of prior application Ser. No. 09/216,126 filed Dec. 18, 1998.

FIELD OF THE INVENTION

This invention relates to improvements in semiconductor processing techniques, and more particularly to improved semiconductor structures and associated methods for making semiconductor structures, or the like, and still more particularly to improvements in a semiconductor structure, and associated method of making, of an encapsulated low resistance gate structure.

BACKGROUND OF THE INVENTION

Gate structures ("word lines") for memory devices are currently fabricated using polycide processes. This process consists of the blanket deposition of a polysilicon layer 30 followed by a blanket deposition of a low resistivity layer 32, typically a metal silicide such a tungsten silicide. This layer can be formed either by direct deposition or metal deposition followed by a reaction anneal step. An overlying layer of silicon nitride 34 is then deposited. The layer structure is then patterned and etched to form narrow lines. A schematic of the gate structure (in cross section) made by this process is shown in FIG. 1.

The sheet resistance of these word line structures is an important consideration, and the current material in use, tungsten silicide ($WSi_2$), has a resistivity of approximately 90 micro-ohm centimeter. This resistivity is unacceptably high for DRAM generations of greater than or equal to 256 MBit. For this reason, a lower resistivity material such a tungsten metal and Ti-silicide ($TiSi_2$) could be used in this application. Subsequent thermal processing of the devices after gate formation involves high temperature anneals, typically greater than or equal to 800° C., one of which is in an oxygen ambient atmosphere. This high temperature anneal in oxygen ambient atmosphere is called "smiling oxidation." All of the layers in the stack must be stable through these processes.

If tungsten, for example, is used as the gate material, the "smiling oxidation" step can cause a serious problem, since tungsten oxidizes easily at these temperatures and forms a volatile oxide. Additionally, a barrier must be interposed between the tungsten and the underlying polysilicon in the gate structure in order to prevent reaction between the two layers. Titanium nitride (TiN) can be used readily for this purpose, and will be exposed to the same thermal treatments as the rest of the stack. Like tungsten, Ti-nitride also oxidizes readily in the "smiling oxidation" ambient atmosphere. Other metals would have similar oxidation problems and barrier requirements. The basic problem, therefore, that is addressed by this invention is a method to yield thin, low resistance metal/polysilicon gate structures with a barrier layer between the metal and polysilicon that can withstand the "smiling oxidation" treatment.

Tungsten oxidation in the formation of gate structures has been an ongoing problem. One of the basic methods of reducing the oxidation of the tungsten in the gate formation is the selective oxidation of silicon rather than tungsten. Thermodynamically, for certain ratios of hydrogen and $H_2O$ in the annealing ambient atmosphere, silicon dioxide ($SiO_2$) will form, but tungsten oxide will not. This approach does not easily address the oxidation of the barrier layer, the ambient atmosphere for which tungsten is robust may not allow the barrier to survive through subsequent processing.

A second approach is to add a non-oxidizing side wall material, such as $Si_3N_4$ to the tungsten gate stack before the "smiling oxidation" treatment, but after the patterning and etching step to form the gate stack. This is also a valid approach, except that the polysilicon will be coated with silicon nitride which would somehow need to be removed selectively in order to allow the polysilicon to be oxidized.

What is needed is a gate structure and associated method of making that has adequate sheet resistance and an encapsulated condition and barrier layer to resist subsequent processing.

It is with the foregoing problems in mind that the instant invention was developed.

SUMMARY OF THE INVENTION

The present invention concerns gate structures, and specifically gate structures having encapsulated metal and barrier layers, and associated methods for making. The encapsulated metal and barrier layers are not subject to oxidation during subsequent processing steps.

In light of the above, therefore, the invention encompasses a gate structure including a polysilicon layer, a barrier layer overlying the polysilicon layer and having opposing sidewalls, a metal layer overlying the barrier layer and having opposing sidewalls, a top dielectric layer overlying the metal layer and having opposing sidewalls, and a vertically oriented dielectric layer extending over and covering each of the opposing sidewalls of the barrier layer and the metal layer to encapsulate the barrier layer and metal layer on the polysilicon layer.

In addition, the invention encompasses a gate structure including a polysilicon layer, a barrier layer overlying the polysilicon layer and having opposing sidewalls, a metal layer overlying the barrier layer and having opposing sidewalls, a top dielectric layer overlying the metal layer, and a vertically oriented dielectric layer extending over and covering each of the opposing sidewalls of the metal layer to encapsulate the metal layer on top of the polysilicon layer.

In a further embodiment, the invention encompasses a gate structure including a polysilicon layer, a metal layer overlying the polysilicon layer and having opposing sidewalls, a barrier layer positioned between the polysilicon layer and the metal layer, and portions of the barrier layer extending over at least a portion of the opposing sidewalls of the metal layer, a top dielectric layer overlying the metal layer and having opposing sidewalls, and a vertically oriented dielectric layer extending over and covering each of the opposing sidewalls of the barrier layer and opposing sidewalls of the metal layer to encapsulate the barrier layer and metal layer on the polysilicon layer.

Further, the instant invention encompasses a method for forming a gate structure on a silicon substrate with an overlying layer of gate oxide, the gate structure having an encapsulated metal and barrier layer, the method including the steps of depositing a polysilicon layer on the gate oxide, the polysilicon layer having a top surface, depositing a sacrificial layer on the polysilicon layer, patterning and etching a trench in the sacrificial layer, the trench having opposing sidewalls and exposing the top surface of the polysilicon layer to form a trench bottom, forming a sidewall layer on the trench sidewalls, the sidewall layer extending to the top surface of the polysilicon layer, forming a barrier layer on the top surface of the polysilicon layer, forming a metal layer in the trench to overly the barrier layer and partially fill the trench, forming a top dielectric layer to overly the metal layer, removing the sacrificial layer, and etching the polysilicon layer to stop on the gate oxide.

Further in addition, the instant invention encompasses a method for forming a gate structure on a silicon substrate with an overlying layer of gate oxide, the gate structure having an encapsulated metal layer. The method includes the steps of depositing a polysilicon layer on the gate oxide, depositing a barrier layer on the polysilicon layer, the barrier layer having a top surface, depositing a sacrificial layer on the barrier layer, patterning and etching a trench in the sacrificial layer, the trench having opposing sidewalls and exposing the top surface of the barrier layer to form a trench bottom, forming a sidewall layer on the trench sidewalls, the sidewall layer extending to the top surface of the barrier layer, forming a metal layer in the trench to overly the barrier layer and partially fill the trench, forming a top dielectric layer to overly the metal layer, removing the sacrificial layer to form a stack of metal, top dielectric layer and the dielectric sidewall, and etching the barrier layer and the polysilicon layer to stop on the gate oxide.

It is a primary object of the present invention to provide an encapsulated metal layer in a gate structure to avoid the oxidation effects of subsequent processing steps.

It is an additional object of the present invention to provide an encapsulated metal layer and barrier layer in a gate structure to avoid the oxidation effects of subsequent processing steps.

These and other objects, features, and advantages of the invention will become apparent to those skilled in the art from the following detailed description, when read in conjunction with the accompanying drawings and appended claims.

DETAILED DESCRIPTION OF THE PREFERRED EMBODIMENT

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention. It will be apparent to those skilled in the art that the invention is also applicable to various integrated circuit processes, structures, and devices.

The problems set forth above are solved by fully encapsulating the metal in the gate structure in order to protect it from the oxidizing atmospheres of subsequent processing steps, such as the "smiling oxidation" step. The barrier layer positioned between the metal layer and the polysilicon layer can also be encapsulated.

Figure 1:
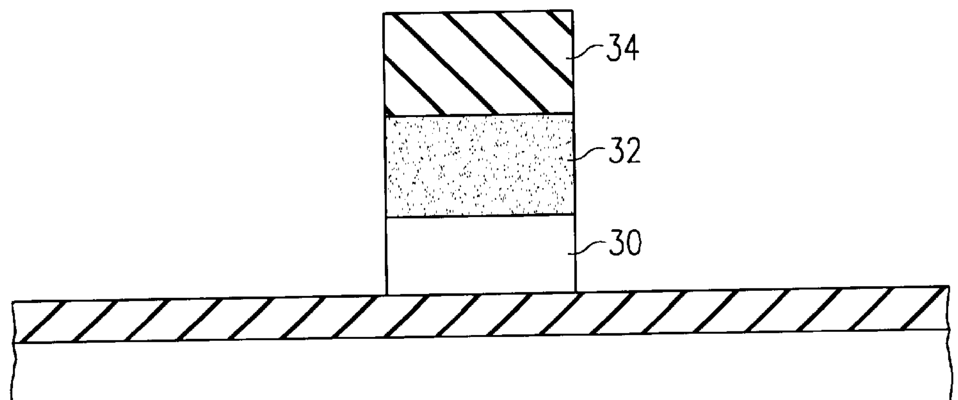
FIG. 1 is a prior art gate structure.
Figure 2:
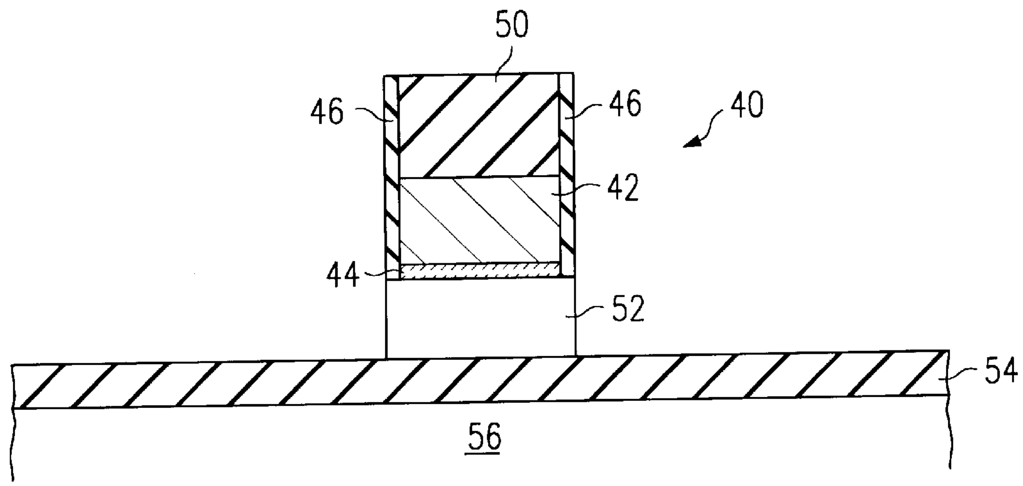
FIG. 2 is an embodiment of the gate structure of the present invention.

FIG. 2 shows a schematic of the expected resulting gate structure 40 obtained by practicing the present invention. The gate structure is part of the transistor, along with the source and drain (in FETP MOS devices). Transistor structures are well-known and are not described herein. The metal layer 42, such as tungsten, and barrier layer 44 are both encapsulated in a dielectric material, such as silicon nitride ($Si_3N_4$), with a thin sidewall layer 46 formed on the sidewalls 48 of the metal layer 42 and barrier layer 44, and a thicker top layer 50 formed on the top of the metal layer 42. The top layer of silicon nitride 50 is present regardless of the metal layer 42 material. The metal layer 42, nitride layers 46, 50, and the barrier layer 44 are all supported on a layer of polysilicon 52. The thickness of the nitride sidewall 46 and top 50 layers isolate the metal 42 and barrier 44 layers from the oxygen during the "smiling oxidation" anneal step. The sidewall 46 nitride thickness should be that which sufficiently protects the metal layer 42 and barrier layer 44.

In FIG. 2, where the invention is utilized in a One Gbit DRAM of the 0.16 micron generation, the polysilicon 52 is approximately 500 to 1000 Å thick, preferably 700 Å, and 0.16 microns wide. The barrier layer 44 is approximately less than 100 Å thick, preferably 50 Å, and 0.14 microns wide. The metal layer 42 is approximately 800 Å thick and 0.14 microns wide. The nitride sidewalls 46 are approximately 100 Å thick (measured laterally), and approximately 2100 Å tall, and the top nitride layer 50 is 1300 Å thick and 0.16 microns wide. The gate structure 40 is formed on a thin layer of gate oxide 54, which is formed on a silicon substrate 56, as is known.

As can be seen in FIG. 2, the nitride sidewalls 46 make the metal layer 42 somewhat narrower than the underlying polysilicon 52. For instance, where the nitride sidewalls 46 are each 100 Å thick, the metal line width is reduced by approximately 200 Å as opposed to being the same thickness as the polysilicon 52. While the reduction in width of the metal layer 42, by itself, is not ideal, the instant gate formation method allows the metal layer 42 to be made thicker, thus compensating for the sheet resistance increase due to the narrower metal line width. The combination of the widths of the metal layer and the opposing sidewall layers are substantially equal to the width of the underlying polysilicon layer. The combination of the widths of the top layer 50 and the widths of the sidewall layers 46 are substantially equal to the width of the underlying polysilicon layer. In addition, where the barrier layer is encapsulated, as described below, the width of the combination of the widths of the barrier layer 44 and the widths of the sidewall layers 46 are substantially equal to the width of the underlying polysilicon layer 52.

The method used to form the inventive gate structure 40 is hereafter described with respect to FIGS. 3 through 13. For simplicity, the barrier layer 44 between the metal layer 42 and the polysilicon layer 52 is not described here in order to focus on the basic steps of the process. The addition of the barrier layer 44 is addressed after the basic steps of the gate structure 40 fabrication process are described. For the purposes of simplicity, tungsten is used as an example of the gate metal layer 42, though the invention is not limited to the use of tungsten in terms of applicability. These steps represent a general process flow. Similarly, numerous variations on this process are possible and may be desirable from a processing point of view.

A layer of polysilicon 52 is formed on a layer of gate oxide 54. The gate oxide layer 54 is formed on a silicon substrate 56, as is known in the art. Again, for the invention's implementation on a 0.16 micron generation one Gbit DRAM, the gate oxide layer 54 is typically approximately 45–100 Å thick (preferably 50). The polysilicon layer 52 is preferably approximately 500–1000 Å thick (preferably 700). The polysilicon 52 can be doped with phosphorous or boron as is known in the art, for the desired application of the gate structure 40.

Figure 3:
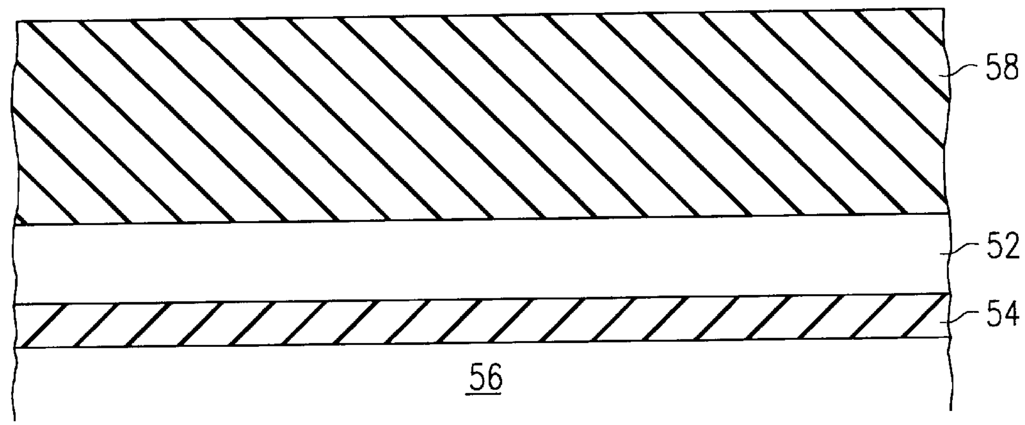
FIGS. 3–13 substantially show the fabrication of the gate structure of the present invention.

Next, a sacrificial layer 58 is deposited on top of the polysilicon layer 52. Silicon dioxide ($SiO_2$) is one example of a suitable sacrificial layer of material, however other materials may be used. Examples of $SiO_2$ which could be used include those deposited by thermal CVD from TEOS precursor, plasma enhanced CVD from TEOS precursor, or plasma enhanced CVD from silane. These $SIO_2$ films may be undoped or doped (for example, PSG). The specific choice of material for this layer would be determined by issues such as etch selectivities between the various materials. The thickness of the sacrificial layer 58 should be approximately the sum of the barrier layer 44, the tungsten layer 42, and the top silicon nitride layer 50 thickness in the final gate structure. This would be approximately 2200 Å for the gate structure 40 shown in FIG. 2. The layer stack structure at this stage is shown in FIG. 3.

Figure 4:
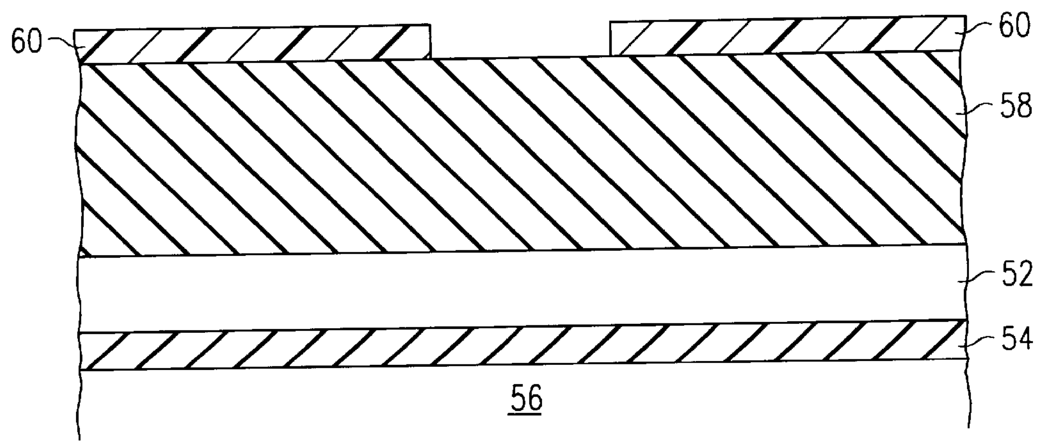

The sacrificial layer 58 is next patterned and etched such that trenches are formed in the sacrificial layer 58 where the gate structures 40 (word lines) will subsequently be formed. Typical available photorest patterning 60 and a subsequent anisotropic etching can be used to form the trenches in the sacrificial layer 58. The usual gate patterning step leaves photoresist lines where the gate structures will be. The current invention differs from the typical existing processes in that the resist is removed in the locations that will eventually form the gate lines. The current invention is therefore an additive, rather than subtractive, process sequence. The desired stack structure with representative photoresist patterning 60 is shown in FIG. 4.

Figure 5:
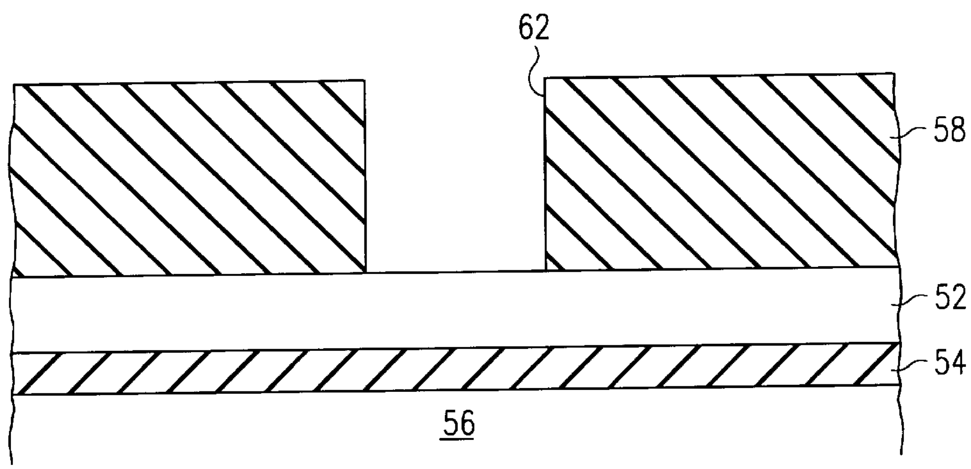

The sacrificial layer 58 is next etched down to the top surface of the polysilicon layer 52, and the excess photoresist is removed. The etch process is preferably an anisotropic etch, having an etch chemistry which is selective to the underlying polysilicon 52. The trench 62 formed in the sacrificial layer 58 terminates on the top surface of the polysilicon 52, and is shown in FIG. 5. The trenches 62 will be filled with the subsequently defined combination of silicon nitride sidewalls 46, a barrier layer 44, tungsten metal 42, and a silicon nitride cap 50, as defined in the following steps.

Figure 6:
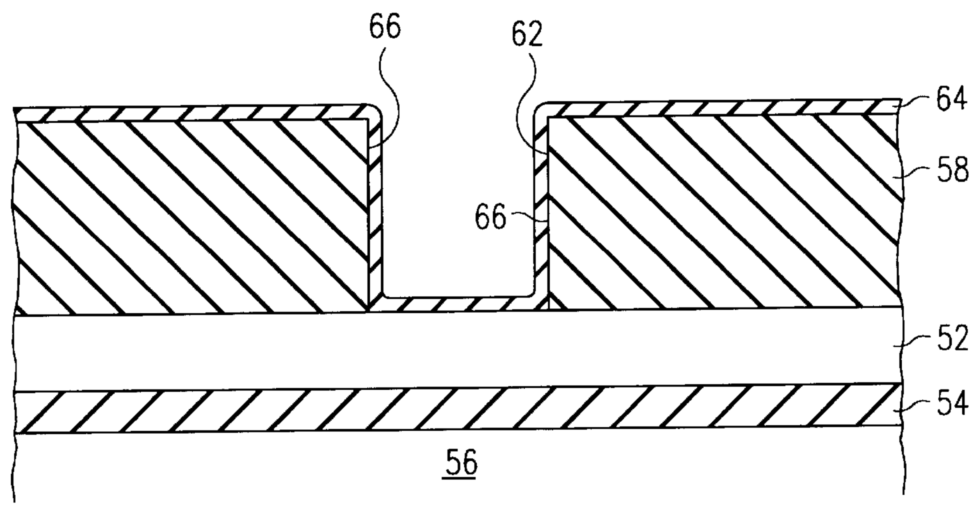

A relatively thin first layer 64 of silicon nitride, or other dielectric, is next conformally deposited on the sacrificial layer 58, on the sidewalls 66 of the trench, and on the top surface of the polysilicon layer 52 exposed in the bottom of the trench 62. Low pressure chemical vapor deposition (LPCVD) of the nitride layer 64 is preferred since it gives close to 100% conformality in the deposition of the nitride. The thickness of the nitride that forms on the sidewalls 66 of the trench 62 should be sufficient to prevent oxidation of the metal layer (i.e., tungsten) in the "smiling oxidation" process after the gate stack structure is completed. A nitride layer 64 on the order of 50 to 100 Å is expected to be sufficient. The structure at this stage is shown in FIG. 6. The nitride layer 64 on the sidewalls 66 of the trench forms the vertically oriented sidewalls 46 of the gate structure 40.

Figure 7:
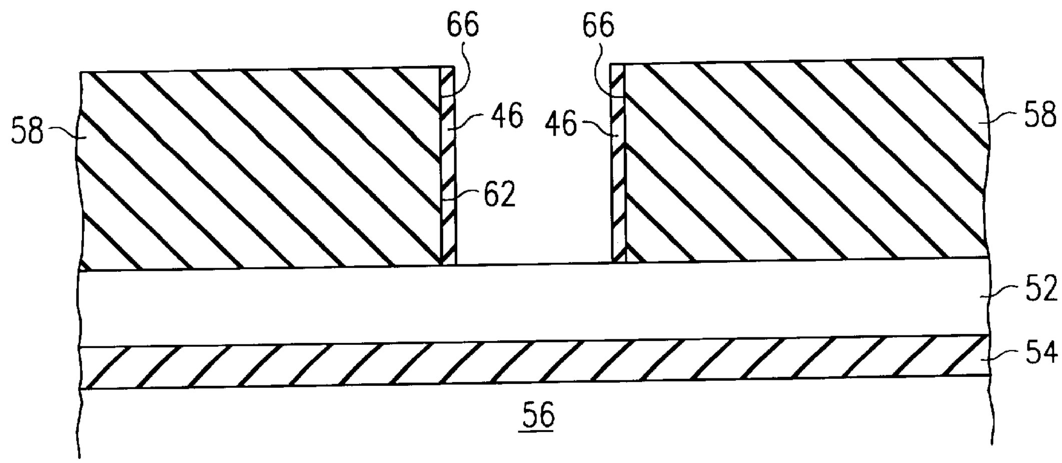
Figure 8:
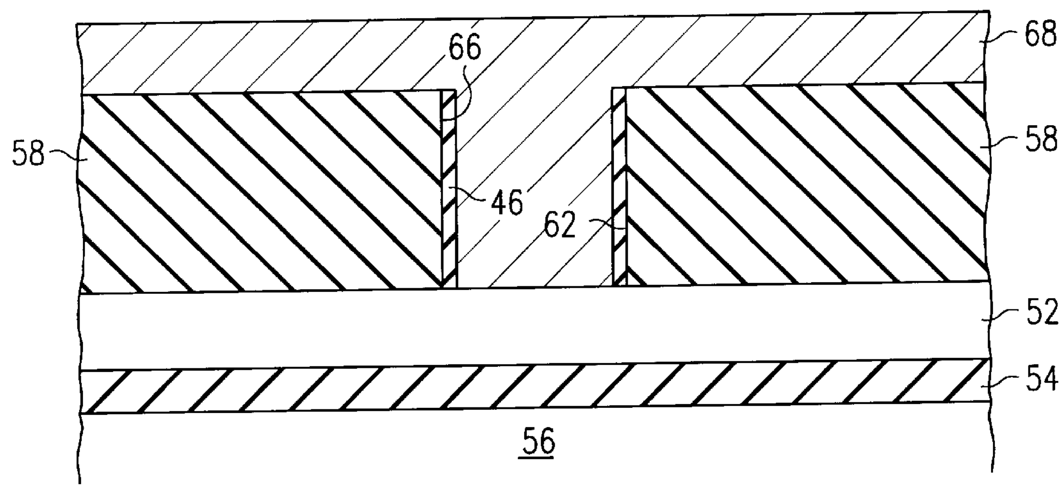

The silicon nitride layer 64 is then removed from the horizontal surfaces, including top surface of the sacrificial layer 58 and the top surface of the polysilicon layer 52 at the bottom of the trench 62. A known or available etch-back process, such as anisotropic etch preferably selective to the sacrificial layer 58 and polysilicon layer 52, can be used. It is of primary important that the silicon nitride layer 64 be removed fully from the bottom of the trench 62, or there will be an insulating layer between the polysilicon 52 and the overlying barrier layer 44 and tungsten metal layer 42. Note that the silicon nitride layer 64 on the sidewalls must remain intact in order to serve as the encapsulant for the subsequently deposited tungsten metal layer 42. The structure at this stage is shown in FIG. 7. Other material can be used to form the sidewalls 46, such as silicon. A thin silicon layer on the side walls may form some $WSi_x$, but it would be a small amount limited by the amount of silicon deposited. The reaction between the W and the underlying silicon (not the side walls) still needs to be prevented by the barrier. Silicon oxynitride (Si-O-N) is another possible material to use for side wall formation. Etch processes need to be adjusted to compensate for the different sidewall material.

Next, tungsten 68 is deposited to conformally fill the trench 62, such as by using a known or available chemical vapor deposition (CVD) process. The resulting structure is shown schematically in FIG. 8. The desired tungsten thickness is sufficient to entirely plug the trench 62. Therefore, if the trench 62 is 2,000 angstroms is depth, the tungsten layer 68 would have to be sufficiently thick to plug the trench 62, and preferably avoid the formation of voids during the CVD deposition process. The practicalities of film deposition non-uniformities and etch-back or CMP selectivities and non-uniformities may limit the range of gate widths which can be processed simultaneously. This range, and the overall robustness of this approach will increases with improvements in process technology.

Figure 9:
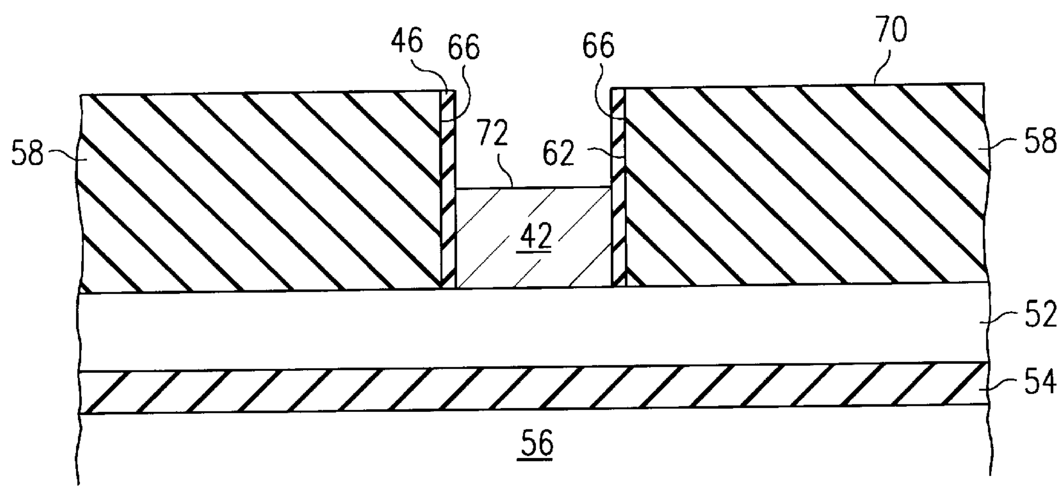

The tungsten metal layer 42 is formed from the metal layer 68 by etching-back the layer 68 to remove it from everywhere outside the trench 62 and leave the trench 62 filled to some level below the top surface 70 of the sacrificial layer. The top difference in height between the top surface 72 of the metal layer 42 and the top surface 70 of the sacrificial layer 58 is the thickness of the top layer 50 of the nitride. The tungsten is thus removed off of the top surface 70 of the sacrificial layer 58 outside of the trench 62. The etch step defines the thickness of the tungsten layer 42, which is fixed after this stage. Note that the silicon nitride sidewall layers 46 formed on the sidewalls 66 of the trench 62 are unaffected by the tungsten etch-back. The etch chemistry used for etching the tungsten metal layer 42 thus is selective to silicon nitride so as to leave a sufficient silicon nitride sidewall layer 46 thickness to effectively encapsulate the metal layer 42. The structure at this stage is shown in FIG. 9.

Figure 10:
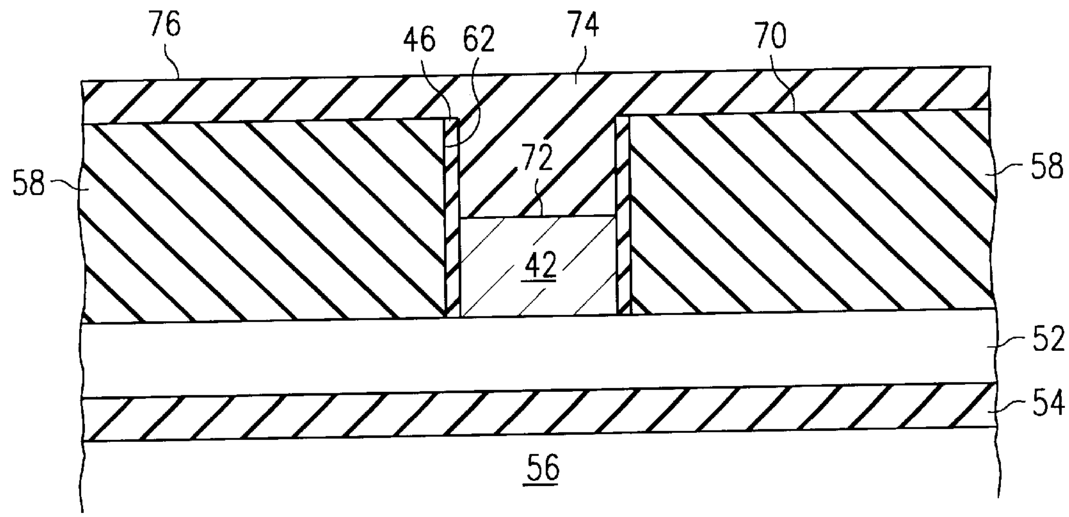
Figure 11:
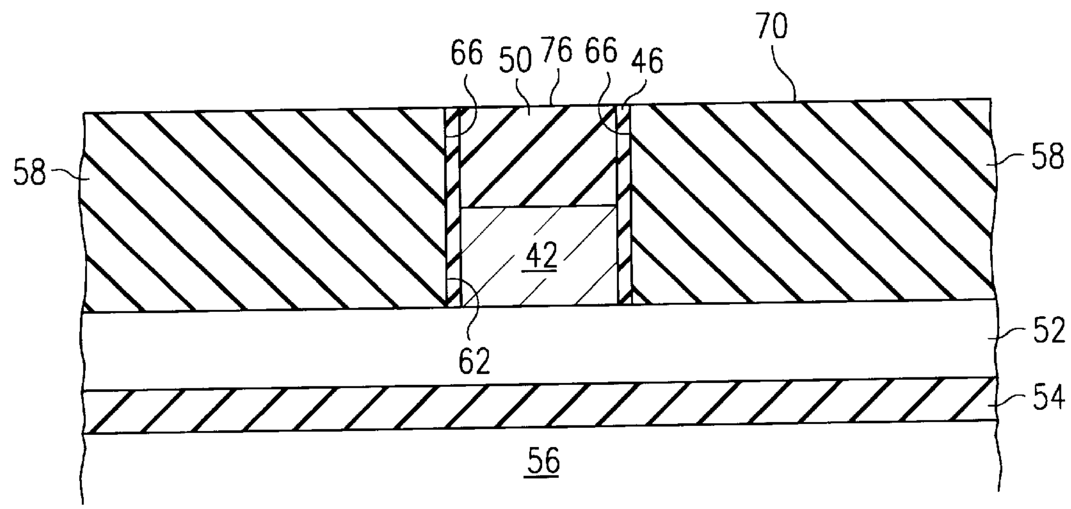

A second top layer 74 of silicon nitride, or other dielectric, is then deposited to refill the trench 62, as is shown in FIG. 10. The silicon nitride 74 is then removed from the surface of the sacrificial layer 58 in a planarizing etch, such as by a chemical mechanical polishing or a blanket etch-back. The second layer 74 of silicon nitride thus forms the top layer 50 of the gate structure 40. The resulting structure is shown in FIG. 11. The second silicon nitride layer 74 is removed such that the top surface 76 of the second silicon nitride layer 74 is flush with the top surface 70 of the sacrificial layer 58. The silicon nitride layer 74 must be removed entirely from the top surface 70 of the sacrificial layer 58. Note that the tungsten 42 is now encapsulated by silicon nitride sidewalls 46 as well as the top layer 50 of nitride, but is in contact with the polysilicon 52 on the bottom surface of the tungsten 42 at the bottom of the trench 62.

Figure 12:
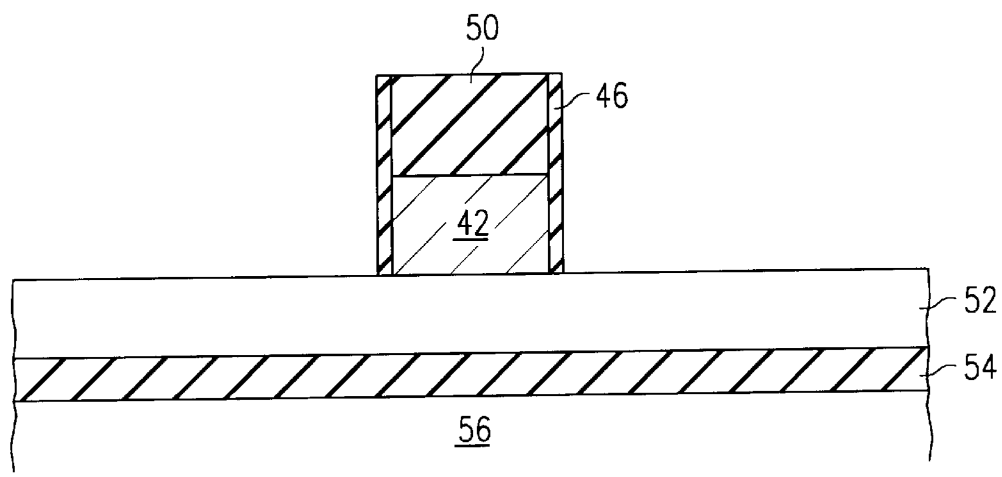

The sacrificial layer 58 is now removed via a known or available plasma or wet etch process. The etch chemistry used in this step must have a high selectivity to silicon nitride and a high selectivity to polysilicon so as to remove the sacrificial layer 58 without significantly affecting the nitride top layer 50 on the metal layer 42, the nitride sidewall layers 46 on the metal layer 42, and the polysilicon layer 52. The structure at this point is shown in FIG. 12. An acceptable etch chemistry may include gases such as vapor HF, or wet etchants, such as HF.

Figure 13:
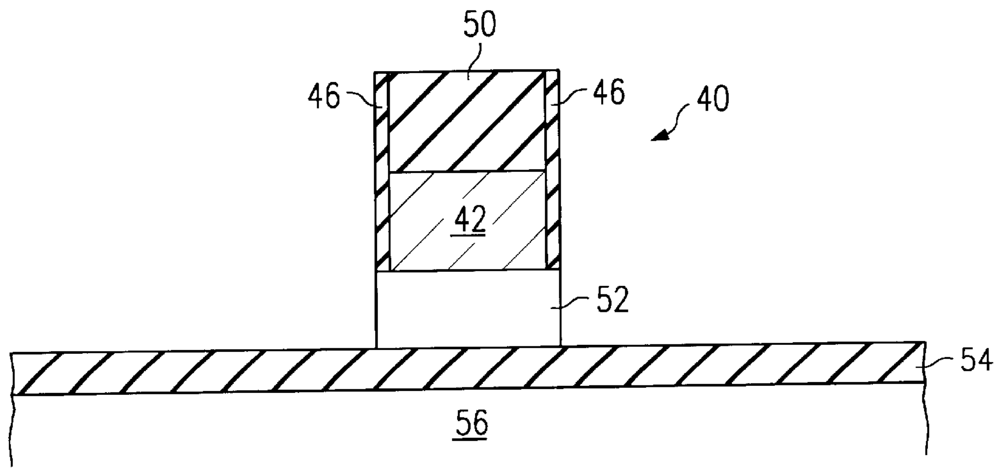

The polysilicon layer 52 is then etched in an anisotropic etch process to remove the polysilicon 52 from the gate oxide 54 everywhere except under the tungsten/nitride stack structure 40. The tungsten/nitride stack structure 40 acts as a pattern to result in a properly sized, self-aligned polysilicon layer 52 formed coextensively below the tungsten/nitride stack structure 40. The polysilicon etch must stop on the top surface of the gate oxide 54, requiring good selectivity to both the gate oxide ($SiO_2$) and the material that makes up the sidewalls 46 and top layer 50 to avoid damage to the gate oxide, and to avoid damage to the sidewalls 46 and top layer 50 in the gate stack structure 40. The resulting gate structure 40 is shown in FIG. 13.

As mentioned above, the metal layer 42 can generally be made thicker in the gate stack structure 40 using the inventive process than the metal layers currently able to be made in existing processes. The reason for this is related to the existing fabrication techniques, which include the sequential deposition of the various layers followed by patterning and etching. A typical gate structure consists of polysilicon, Ti-nitride, tungsten, and silicon nitride (from the bottom-up), and all of these layers have to be etched in sequence from top-down. The etch process places limitations on the thicknesses of the individual layers due to etch selectivity issues. In particular, relatively thick Ti-nitride and polysilicon are needed to allow a controllable and robust etch sequence, which limits the allowable tungsten thickness.

In the present invention, the stack 40 is not etched as a whole, and all but one etch step are blanket etches. The only etch for which thin structures are formed is the etch which forms initial trench 62 definition of the sacrificial layer 58. The polysilicon layer 52 and barrier layer 44 could potentially be thinner, and the metal layer 42 thicker, offsetting the loss in line width due to the encroachment of the silicon nitride sidewalls 46 into the width of the metal layer 42.

The presence of a barrier layer 44 between the metal layer 42 and the polysilicon layer 52 has been found to be beneficial because it inhibits the diffusion of the metal into the polysilicon. The implementation of a barrier layer 44 in the inventive gate stack structure 40 requires a modification to the process set forth above. The different varieties of barrier layer structures are set forth in FIGS. 2, 14 and 15.

One method of incorporating a barrier layer 44 is to sequentially deposit the polysilicon layer 52 on the gate oxide 54, and then deposit a barrier layer 44 on the polysilicon layer 52, between the polysilicon layer 52 and the sacrificial layer. Following the deposition of this layer structure, the previously enumerated steps could be used with slight modification to the sacrificial layer 58 etch, which would need to stop on the barrier layer 44, and then the final polysilicon 52 etch which would have two components, first a barrier layer 44 etch component and then a polysilicon layer 52 etch component.

Figure 14:
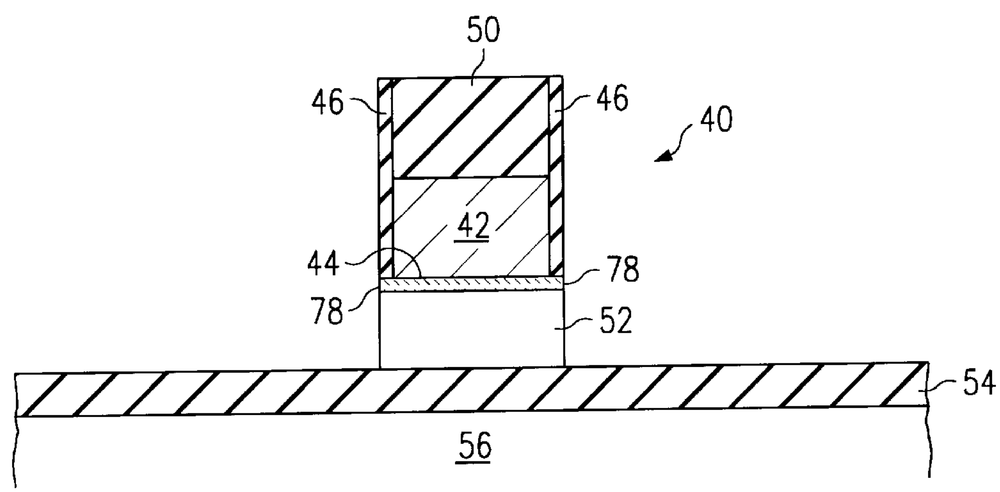
FIG. 14 is another embodiment of the gate structure of the present invention.

The resulting structure is shown on FIG. 14. This structure has an encapsulated tungsten metal layer 44, but exposed barrier layer 44 edges 78. The barrier layer 44 would thus need to preferably be oxidation resistant, such as titanium aluminum nitride ($Ti_xAl_yN_z$), chromium nitride ($Cr_xN_y$), chromium aluminum nitride ($Cr_xAl_yN_z$), tantalum silicon nitride ($Ta_xSi_yN_z$), tungsten silicon nitride ($W_xSi_yN_z$), titanium silicon nitride ($Ti_xSi_yN_z$), or other like oxidation resistant material. In addition, a conductive oxide may also suffice.

The use of a fully encapsulated barrier layer 44 may be desirable, as is seen in FIG. 2. In this case it is important that the barrier layer 44 cover the bottom of the trench 62 (the location of the ultimate interface between the tungsten metal layer 42 and the polysilicon layer 52), while at the same time covering as little of the sidewalls as possible. The most desirable case would be that shown in FIG. 2 where the barrier layer 44 is only at the metal layer 44, polysilicon layer 52 interface, and not extending up the sidewalls of the metal layer 44 and top layer 50 of the trench. This structural limitation can be accomplished in several ways. The materials mentioned above with respect to an exposed barrier (shown in FIG. 14) could also be used for an encapsulated barrier structure.

The first way to form a fully encapsulated barrier layer 44 involves plasma processing to form a "self aligned" barrier layer. After formation of the trench 62 and the definition of a nitride layer 64, forming sidewalls 46, and etching the nitride off the bottom of the trench (FIG. 7) in the above process, a silicide forming metal (such as titanium) is deposited to a thickness of approximately 50 to 100 Å on the bottom of the trench. This would result in a layer of titanium silicide approximately 100 to 200 Å thick. A high level of conformality is not needed, so long as there is some metal at the base of the trench in contact with the polysilicon. An annealing treatment is performed to form the metal silicide selectively on the top surface of the polysilicon 52 in the trench 62. This processing is typically done in a nitrogen ambient atmosphere, so that the remaining non-silicided material is either the original metal or the metal nitride. A selective wet etch is then used to remove the non-silicided material (for the case of Ti-silicide ($TiSi_2$), for example, the etchant can be $H_2O_2$). This yields a silicide layer, such as ti-silicide, present only in the base of the trench 62 on the top surface of the polysilicon 52. The self-aligned silicide layer could then be plasma treated (such as a nitrogen plasma) to form a thin nitrided layer (Ti-silicide nitride) that could serve as a barrier layer 44. Ti-silicide nitride (TiSiN) for example, has been shown to serve as an adequate barrier layer for aluminum and copper metallization. Since the starting silicide is only present at the base of the trench 62, the barrier is only formed there.

Alternatively, thermal processing such as annealing in $N_2$ or $NH_3$ could be used to form the thin self-aligned nitrided barrier layer 44. A thin silicon nitride layer could also potentially be used as the barrier layer 44 since it is considered relatively electrically "leaky." A very thin (approximately 10–20 Å) layer of silicon nitride would suffice. This layer would be sufficiently thick to prevent tungsten silicidation of the metal layer with the polysilicon, but is electrically leaky enough to allow sufficient conduction. The silicon nitride could be formed by either a plasma or a thermal treatment like the silicide case mentioned above. This process could yield the fully encapsulated barrier layer as shown on FIG. 2. The rest of the gate stack structure 40 is then formed using the method described above.

A second way to form a fully encapsulated barrier layer 44 at the base of the trench 62 would be to use a selective barrier deposition process, such that the material only forms in contact with the polysilicon 52, but not on the sacrificial layer material 58 or the nitride sidewalls 46. One way to accomplish this would be with ionized sputtering, which results in good bottom coverage and very minimal sidewall coverage for small openings with very high aspect ratios. This technique can be used to deposit any of the metal nitride or metal silicon nitride materials mentioned previously.

Still another way to form the barrier layer in the base of the trench would be to form a thin (10–20 Å) silicon nitride layer on the top surface of the polysilicon, such that it was sufficiently thick to prevent tungsten silicidation of the metal layer with the polysilicon, but is electrically leaky enough to allow sufficient conduction. In this case, the silicon nitride would also be on the sidewalls of the metal layer, but it would simply blend in with the nitride sidewalls in subsequent processing. The processing after the metal layer deposition would proceed as defined above.

Figure 15:
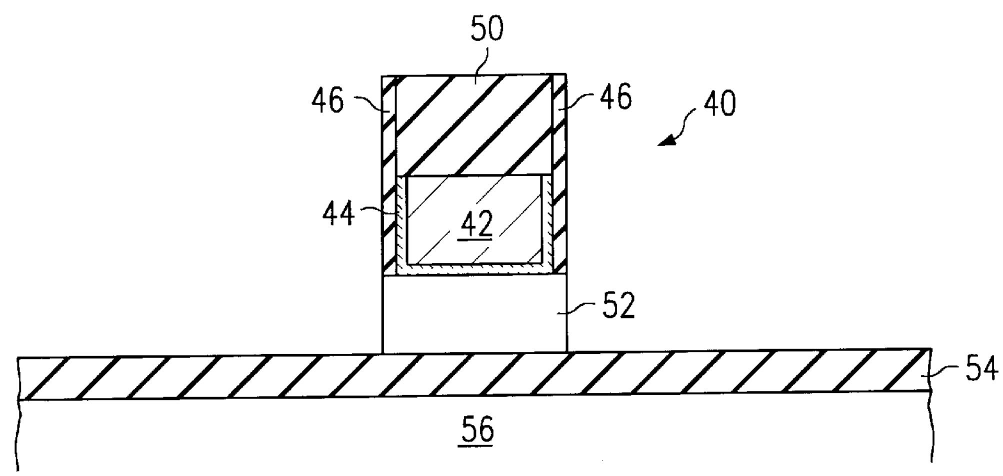
FIG. 15 is another embodiment of the gate structure of the present invention.

Having some of the barrier layer 44 material on the sidewalls of the metal layer would not necessarily be a fundamental problem. For example, the structure shown in FIG. 15 could be acceptable. The barrier in FIG. 14 could be deposited by a fairly conformal method, either CVD or collimated sputtering Ti-nitride would be one of the possible materials. This would result in deposition on the sidewalls of the trench 62, as well as on the field. The tungsten layer 42 can then be deposited and etched back as before. The tungsten metal layer 42 would then have Ti-nitride and nitride as sidewalls. The Ti-nitride on the field and that extending above the metal layer 42 on the trench sidewalls 66 could then be removed by a wet etch (using, e.g., $H_2O_2$). Processing could then proceed as before, starting with the deposition of the second silicon nitride layer. The final structure would then have a fully encapsulated barrier layer formed on the bottom and side surfaces of the metal layer, as shown in FIG. 15. The materials mentioned as suitable for exposed barriers above, with respect to FIG. 14, would also be suitable here.

The advantages of this invention are:

1. The tungsten layer and barrier layer can be completely encapsulated, while the polysilicon layer is exposed to the ambient atmosphere, allowing easy oxidation during the "smiling oxidation" step. No special ambient atmosphere would be required during the "smiling oxidation" step to prevent tungsten metal layer or barrier layer oxidation.

2. Since the barrier layer can be encapsulated, an oxidation resistant barrier layer material is not required. Since Ti-nitride has been shown to be sufficient to prevent interaction between the silicon and the tungsten metal layer, it could be used for this purpose. Ti-nitride is a mature material and familiar in the semiconductor industry.

3. Due to the simplification of the stack with respect to etching issues, the metal layer 42 can be made thicker than current processes prefer. This would be helpful for future generations of semiconductors since the total gate stack 40 height decreases with each generation.

While this invention has been described with reference to the illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method for forming a gate structure in a semiconductor device, the gate structure formed on a silicon substrate with an overlying layer of gate oxide, the gate structure having an encapsulated metal and barrier layer, the method comprising the acts of:

depositing a polysilicon layer on the gate oxide, the polysilicon layer having a top surface;

depositing a sacrificial layer;

patterning and etching a trench in said sacrificial layer, said trench having opposing sidewalls and exposing said top surface of said polysilicon layer to form a trench bottom;

forming a sidewall layer on said trench sidewalls, said sidewall layer extending to said top surface of said polysilicon layer;

forming a barrier layer on said top surface of said polysilicon layer;

forming a metal layer in said trench to overly said barrier layer and partially fill said trench;

forming a top dielectric layer overly said metal layer;

removing said sacrificial layer; and etching said polysilicon layer to stop on said gate oxide.

2. A method for forming a gate structure of a semiconductor device, the gate structure formed on a silicon substrate with an overlying layer of gate oxide, the gate structure having an encapsulated metal layer, the method comprising the acts of:

depositing a polysilicon layer on the gate oxide;

depositing a barrier layer on said polysilicon layer, the barrier layer having a top surface;

depositing a sacrificial layer;

patterning and etching a trench in said sacrificial layer, said trench having opposing sidewalls and exposing said top surface of said barrier layer to form a trench bottom;

forming a sidewall layer on said trench sidewalls, said sidewall layer extending to said top surface of said barrier layer;

forming a metal layer in said trench to overly said barrier layer and partially fill said trench;

forming a top dielectric layer to overly said metal layer;

removing said sacrificial layer to form a stack of metal, top dielectric layer and said dielectric sidewall; and etching said barrier layer and said polysilicon layer to stop on said gate oxide.

* * * * *